United States Patent [19]

Zimmer et al.

[11] 4,084,133
[45] Apr. 11, 1978

[54] METHOD OF AND APPARATUS FOR DETERMINING THE DIRECTION OF THE MUTUAL TEMPORAL SHIFT OF AT LEAST TWO SIMILAR STOCHASTIC SIGNALS

[75] Inventors: Christian Zimmer, Koniz; Heinrich Ryser, Schlieren, both of Switzerland

[73] Assignee: Hasler AG, Bern, Switzerland

[21] Appl. No.: 761,277

[22] Filed: Jan. 21, 1977

[30] Foreign Application Priority Data

Feb. 6, 1976 Switzerland ............... 14557/76

[51] Int. Cl.² .................. G01R 25/00; H03D 13/00
[52] U.S. Cl. ......................... 324/83 A; 307/232; 324/165; 328/133; 340/271
[58] Field of Search .............. 324/165, 163, 83 R, 324/83 A; 328/133, 151, 1, 5; 307/232, 358; 340/271

[56] References Cited

U.S. PATENT DOCUMENTS

| 3,614,616 | 10/1971 | Bucek et al. ............... 340/271 |
| 3,683,285 | 8/1972 | Wild ........................... 328/133 |
| 3,728,565 | 4/1973 | O'Callaghan ................ 324/165 |

OTHER PUBLICATIONS

Vermeulen, J. C.; Distance Measuring, IBM Tech. Bull., vol. 14, No. 7, Dec. 1971, pp. 2063-2065.
Jackson, H. C.; Logical Motion and Direction Detection; IBM Tech. Bull., vol. 14, No. 12, May 1972, pp. 3672-3673.
Crisp, J. M.; Asynchronous Direction of Motion Detection; IBM Tech. Bull., vol. 15, No. 1, (June 1972) pp. 114-115.
Crisp, J. M.; Direction and Speed Detection Circuit; IBM Tech. Bull.; vol. 15, No. 4, Sept. 1972, pp. 1198-1199.

*Primary Examiner*—Robert J. Corcoran
*Attorney, Agent, or Firm*—Brady, O'Boyle & Gates

[57] ABSTRACT

Circuitry having at least two stores for the periodical storage of instantaneous values of at least two similar stochastic signals, at least two comparison circuits for comparing during a comparison time interval the stored values with subsequently occurring values of the other signal and for the formation of two positive functions depending on the comparison results, a device for the temporal integration of the differences of the two functions, and a device for indicating the sign of the result of the integration thus providing a determination of the direction of the mutual temporal shift T of the two stochastic signals.

5 Claims, 5 Drawing Figures

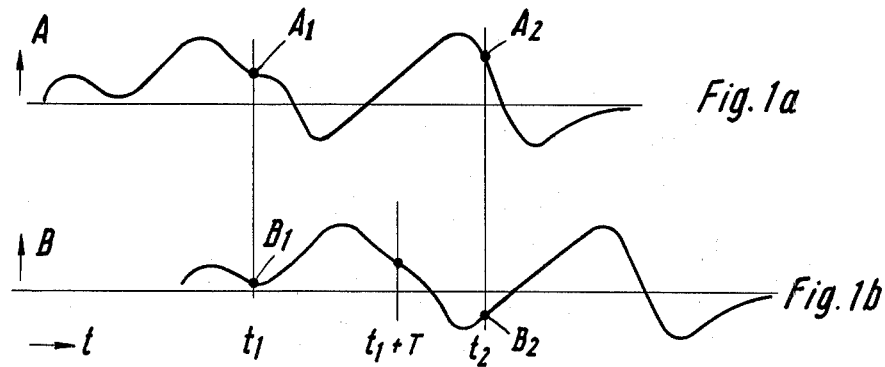
Fig. 1a
Fig. 1b
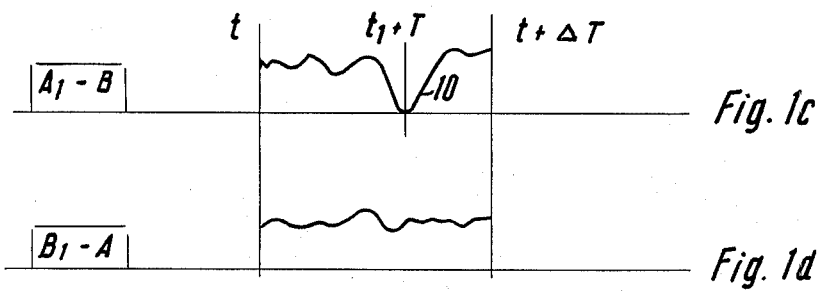
Fig. 1c
Fig. 1d
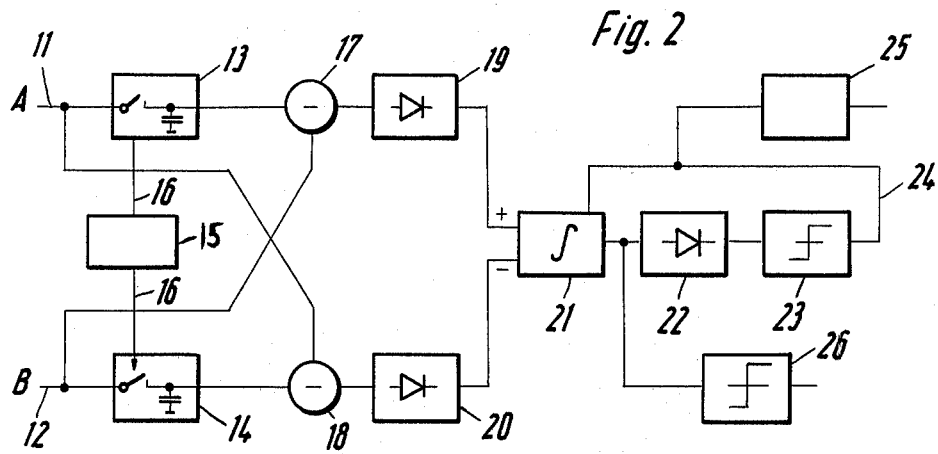
Fig. 2

METHOD OF AND APPARATUS FOR DETERMINING THE DIRECTION OF THE MUTUAL TEMPORAL SHIFT OF AT LEAST TWO SIMILAR STOCHASTIC SIGNALS

BACKGROUND OF THE INVENTION

The invention relates to a method of and apparatus for determining the sign or sign digit of the mutual temporal shift T of two similar stochastic signals.

Such signals arise, for example, in correlation speed meters (speedometers or tachometers) in which irregular properties of a surface are picked-up by two constantly spaced pick-ups moved relative to the surface. It is often desirable to ascertain simply the direction in which the movement is effected, without measuring the speed accurately.

SUMMARY OF THE INVENTION

The present invention provides a method of determining the direction of the mutual temporal shift T of at least two similar stochastic signals, wherein at regular intervals instantaneous values of the two signals are stored and during a comparison time interval the stored value of either signal is repeatedly or continuously compared with the actual values of the other signal, thereby obtaining two comparison series, the comparison time interval containing a region $T \pm \tau$ after the instant of the storage of the instantaneous value; wherein in an accumulator results, dependent on the comparison, of positive sign of the one comparison series are added, those, equally of positive sign, of the other comparison series are subtracted, and wherein the sign of the value in the accumulator indicates the direction of shift.

The invention also provides apparatus for determining the direction of the mutual temporal shift T of at least two similar stochastic signals, comprising: at least two stores for the periodical storage of instantaneous values of the two signals; at least two comparison circuits for comparing the stored values with subsequently occurring values of the other signal and for the formation of two positive functions depending on the comparison results; a device for the temporal integration of the differences of the two function; and a device for indicating the sign of the result of the integration.

BRIEF DESCRIPTION OF THE DRAWINGS

The invention will be described further, by way of example, with reference to the accompanying drawings, wherein:

FIGS. 1a to 1d are graphic illustrations showing time functions are explaining the method; and FIG. 2 is a schematic block diagram of apparatus for carrying out the method.

DESCRIPTION OF THE PREFERRED EMBODIMENT

In FIG. 1a, 1 is the value of a stochastic signal A as a function of time. At a time $t_1$ it has a value $A_1$, and at a time $t_2$ it has a value $A_2$.

Represented in FIG. 1b is a second stochastic signal B which is similar to the signal A, but is shifted by the time T.

The value $A_1$ is stored and continuously the difference $A_1 - B$ is formed for B equals $B_1 \ldots B_2$. The same takes place conversely with $B_1$ for $A_1 \ldots A_2$. From the differences obtained, two functions of positive sign are derived in the time interval $t_1 \ldots t_2$, and subtracted continuously from one another. There is thus formed:

$$\int_{t_1}^{t_2} [f(A_1 - B) - f(B_1 - A)] \, dt$$

Examples for $f$ are:
$f_1 = |A-B|, f_2 = (A-B)^2, f_3 = |A \cdot B|$

In FIG. 1c the course of $|A_1 - B|$, and in FIG. 1d the course of $|B_1 - A|$ on an average for a fairly large number of determinations is plotted. In the case of all the values of $t$ between $t$ and $t + \Delta t$ ($\Delta t = t_2 - t_1$) there occurs a mean value which is generally constant, but in FIG. 1c for the time $t_1 + T$ has a dip or drop 10 which reaches the zero line when at this point the two values subtracted from one another are at all times the same. Consequently, the average value of the function in accordance with FIG. 1c is smaller than that in accordance with FIG. 1d, from which it can be concluded that the function in accordance with FIG. 1b assumes the same values later than that of FIG. 1a. In the case of a correlation speed meter thus the direction of movement is ascertained.

Shown in FIG. 2 is a circuit diagram for carrying out the method. 11 and 12 are the two inputs to which the signals A and B are fed. 13 and 14 are two sample and hold circuits which, controlled by the timing generator 15 via line 16, at regular intervals $\Delta t$ sample the value of A or respective B at the input and hold it constantly available at the output up to the next sampling.

In two subtraction circuits 17 and 18 continuously the differences $A_n - B$ and $B_n - A$ are formed, in which respect $A_n$ and $B_n$ denote the values respectively stored in the sample circuits. Through full-wave rectification in the rectifiers 19 and 20, the absolute values are formed. The differences of the two values delivered by the rectifiers are integrated in the integrator 21. Depending which of the two values delivered by the rectifiers 19 and 20 is greater on an average, the output voltage of the integrator runs to a positive or negative final value, which is fed via a rectifier 22 to the threshold circuit 23. This generates, upon the exceeding of the threshold value, a signal on line 24, whereby the integrator 21 is set to zero. From the polarity of the integrator output upon the appearance of the signal on line 24 or of the time average, conclusions can be drawn as to the direction of movement. This indication is effected by circuit 26.

A circuit 25 ascertains whether during a predetermined time a signal has appeared on line 24 or not. If this is not the case, it can be concluded therefrom that the integral indicated in the equation is almost equal to 0, from which it can further be concluded that A and B are constant or that — in the case of a correlation speed meter no movement is present between pick-up and scanned surface.

The control signals for the two sample and hold circuits 13 and 14 do not have to be given simultaneously, but can be temporally shifted relative to one another. Also several series circuits of units 13, 17, 19 or respectively 14, 18, 20 with inputs and outputs can be connected in parallel and be selected periodically temporally mutually shifted. Thus the indication at the output of the integrator is accordingly accelerated.

A reliable decision as to whether the signal at the output of the integrator 21 is positive or negative can be effected all the more rapidly (apart from the multiplication of the comparison devices as described in the previous paragraph) the greater the ratio of the duration of the dip 10 in FIG. 1c with regard to the comparison time $\Delta t$. One thus selects $\Delta t$ advantageously so that the entire dip 10 lies in the comparison interval, but that this interval is as small as possible.

If one has a signal available which is approximately proportional to the shift time T — in the case of a speed meter approximately inversely proportional to the speed — then it is advantageous to have the timing generator 15 controlled by this speed signal, so that the condition indicated above is met.

One can also shorten the comparison time in that one has the comparison begin only at a time $t + p \Delta t$, wherein $p < 1$. The choice $p$ depends on the accuracy with which the speed signal is proportional to the shift time T, since, as has already been said, the dip 10 has to fall in the comparison time.

One can also make during the time $t \ldots t + \frac{1}{2} \Delta t$ a comparison of B or respectively A with the value, obtained at the time $t - \frac{1}{2} \Delta t$, of A or respectively B and during the time $t + \frac{1}{2} \Delta t \ldots t + \Delta t$ with the values obtained at the time $t$. In this way one obtains during the time $\Delta t$ two dips 10 and a doubling of the indication speed.

A further possibility for shortening the comparison time arises when several similar, temporally shifted stochastic signals are available, which stem for example in the case of a speed meter from several pick-ups arranged one after the other. Then one can form pairs of two signals each and undertake between them the comparison and feed the comparison results to the integrator 21. The evaluation of the integrator signal is not changed.

Instead of making the comparisons of $A_1$ or, respectively, $B_1$ with continuous values of B or A, individual periodically sampled values of B and A can be used. The spacing of the sampling values only has to be smaller than the width of the dip 10.

Instead of the integrator 21, a low-pass filter can be used. For the standstill indication the restoration line 24 and the indication device 25 are obviated and the indication is effected directly by the threshold circuit 23.

Instead of being effected in analogue manner as in accordance with FIG. 2 the calculation of the integrals can also be effected digitally. In this case an A/D converter would convert the input values A and B alternately into digital values, store respectively at least one value of A and B and undertake the comparisons with values, following thereon and also converted analogue/digitally, of the other line. The sample and hold circuit is then replaced by a store, the subtraction circuits are replaced by arithmetical calculating circuits and the integrator 21 is replaced by a counter.

The terms and expressions which have been employed herein are used as terms of description and not of limitation, and there is no intention, in the use of such terms and expressions, of excluding any equivalents of the features shown and described or portions thereof but it is recognized that various modifications are possible within the scope of the invention claimed.

What is claimed is:

1. A method of determining the direction of the mutual temporal shift T of at least two similar stochastic signals, wherein at regular intervals instantaneous values of the two signals are stored and during a comparison time interval the stored value of each signal is repeatedly or continuously compared with the actual values of the other signal, thereby obtaining two comparison series, the comparison time interval containing a region $T \pm \tau$ after the instant of the storage of the instantaneous value; wherein in an accumulator results, dependent on the comparison, of positive sign of the one comparison series are added, those, equally of positive sign, of the other comparison series are subtracted, and wherein the sign of the value in the accumulator indicates the direction of shift.

2. A method as set forth in claim 1, wherein when more than two time shifted stochastic signals are available, pairs of signals are formed and in that the comparison procedure is carried out respectively with the signals of each pair.

3. A method as set forth in claim 1, wherein the comparison time interval is dependent on an approximately measured value T which is obtained from a measurement of the maximum of the power spectrum of at least one of the stochastic signals.

4. Apparatus for determining the direction of the mutual temporal shift T of at least two similar stochastic signals, comprising: at least two stores for the periodical storage of instantaneous values of the two signals; means including at least two comparison circuits for comparing the stored values with subsequently occurring values of the other signal and for the formation of two positive functions depending on the comparison results; a device for the time integration of the differences of the two functions, and a device for indicating the sign of the result of the integration.

5. Apparatus as set forth in claim 4, and having a device, connected to the device for the time integration, for discriminating whether the output signal of this device exceeds, or not, a specific positive or negative ascending speed.

* * * * *